United States Patent [19]
Hoffmeyer

[11] Patent Number: 6,134,776
[45] Date of Patent: Oct. 24, 2000

[54] HEATSINK AND PACKAGE STRUCTURE FOR WIREBOND CHIP REWORK AND REPLACEMENT

[75] Inventor: Mark Kenneth Hoffmeyer, Rochester, Minn.

[73] Assignee: International Business Machines Corporation, Armonk, N.Y.

[21] Appl. No.: 09/019,110

[22] Filed: Feb. 5, 1998

Related U.S. Application Data

[62] Division of application No. 08/763,372, Dec. 13, 1996, Pat. No. 5,757,073.

[51] Int. Cl.$^7$ .................................................... H05K 3/34
[52] U.S. Cl. ................................ 29/840; 29/832; 29/830; 29/837; 29/842; 438/119; 257/700; 257/706; 156/94
[58] Field of Search ............................. 29/830, 840, 841, 29/832; 438/15, 119, 4; 257/717, 700, 738, 706, 701, 707, 787, 796; 156/94, 297

[56] References Cited

U.S. PATENT DOCUMENTS

| | | | |
|---|---|---|---|
| 4,012,832 | 3/1977 | Crane | 29/575 |
| 4,075,388 | 2/1978 | Doss | 428/297 |
| 4,242,157 | 12/1980 | Gehle | 156/64 |

(List continued on next page.)

FOREIGN PATENT DOCUMENTS

| | | |
|---|---|---|
| 4058551 | 2/1992 | Japan . |
| 5347474 | 12/1993 | Japan . |

OTHER PUBLICATIONS

U.S. Patent application Ser. No. 08/349,854, filed Dec. 6, 1994, entitled Reworkable Electronic Apparatus Having a Fusible Layer for Adhesively Attached Components, and Method Therefor.

U.S. Patent application Ser. No. 08/530,452, filed Sep. 19, 1995, entitled Method and System for Reworkable Direct Chip Attach (DCA) Structure with Thermal Enhancement.

*Primary Examiner*—Lee Young
*Assistant Examiner*—Sean Smith
*Attorney, Agent, or Firm*—Robert W. Lahtinen

[57] ABSTRACT

A direct chip attach to heatsink structure is shown and described which implements rework when the chip must be removed and replaced. A laminated heatsink includes a metal heatsink with a foil layer adhered to the chip attachment surface with the assembly secured to a carrier at a cutout opening therein that defines the chip attach site. The adhesive, either a dry film adhesive or a pressure sensitive adhesive, secures foil layer to heatsink and provides the interface of separation when a chip must be removed and replaced. By peeling the foil away from the heatsink, the foil, chip and non-reworkable die attach adhesive are removed as a unit, leaving no chip attach adhesive residue at the attachment site to be scraped or abraded away. The replacement chip can be installed either by directly installing with new die attach adhesive or by first restoring the foil layer prior to chip installation. The foil may be applied over the entire surface of the heatsink or may be patterned to provide the laminated foil coating only beneath the chip attach site. Further, the foil and heatsink may be of dissimilar metals to impart varying characteristics, such as a solderable surface to an aluminum heatsink.

Also, the technique would be applicable to direct chip attachment directly to a rigid or flexible electronic circuit carrier assembly. In another form, the invention may be implemented using a foil layer with adhesive on both sides to secure the chip to a heatsink at the carrier assembly chip attach location. A further form of the invention uses a tape cavity packaging structure wherein the carrier assembly includes a laminated carrier/heatsink with aligned openings that create a chip attach cavity in the package and foil bonded to the heatsink across the base of the chip cavity by a layer of adhesive that also presents a chip attach adhesive across the base of the chip attach cavity. The structure affords a low profile assembly, enables rework/replacement, shortens wire lengths and reduces wirebond loop heights.

10 Claims, 7 Drawing Sheets

U.S. PATENT DOCUMENTS

| | | | |
|---|---|---|---|
| 4,436,242 | 3/1984 | Shisler et al. | 228/264 |
| 4,664,739 | 5/1987 | Aurichio | 156/344 |
| 4,818,823 | 4/1989 | Bradley | 174/68.5 |
| 4,936,010 | 6/1990 | Siuzdak | 29/840 |
| 5,072,874 | 12/1991 | Bertram et al. | 29/840 |
| 5,137,836 | 8/1992 | Lam | 437/8 |
| 5,146,981 | 9/1992 | Samarov | 165/185 |
| 5,182,852 | 2/1993 | Montanari | 29/840 |
| 5,253,010 | 10/1993 | Oku et al. | 354/485 |
| 5,268,048 | 12/1993 | Leibovitz et al. | 156/94 |
| 5,451,285 | 9/1995 | Santo et al. | 156/264 |
| 5,471,027 | 11/1995 | Call et al. | 219/85.13 |
| 5,601,675 | 2/1997 | Hoffmeyer et al. | 156/94 |
| 5,616,958 | 4/1997 | Laine et al. | 257/717 |
| 5,632,438 | 5/1997 | Hoffmeyer et al. | 228/180.5 |

HEATSINK AND PACKAGE STRUCTURE FOR WIREBOND CHIP REWORK AND REPLACEMENT

REFERENCE TO PATENT APPLICATION

This is a division of application Ser. No. 08/763,372, filed Dec. 13, 1996, now U.S. Pat. No. 5,757,073 which is hereby incorporated herein by reference in its entirety.

CROSS-REFERENCE

This patent application is related to U.S. patent application Ser. No. 08/349,854, filed Dec. 6, 1994, now U.S. Pat. No. 5,601,675, entitled REWORKABLE ELECTRONIC APPARATUS HAVING A FUSIBLE LAYER FOR ADHESIVELY ATTACHED COMPONENTS, AND METHOD THEREFOR and U.S. patent application Ser. No. 08/530,452, filed Sep. 19, 1995, entitled METHOD AND SYSTEM FOR REWORKABLE DIRECT CHIP ATTACH (DCA) STRUCTURE WITH THERMAL ENHANCEMENT, both assigned to the assignee of the instant Patent Application.

FIELD OF THE INVENTION

The present invention relates to the surface mounting of electronic components and more particularly to a mounting technique that permits easy removal and replacement when rework is required.

BACKGROUND OF THE INVENTION

It is common practice in electronic packaging to provide carrier structures with enhanced heat dissipation characteristics to assist in the cooling of attached components and subassemblies. With specific emphasis on chip on flex (COF) and chip on board (COB) packaging used for direct attach of integrated circuit chips to a variety of carriers including flexible polyimides, glass reinforced epoxy (FR4), and ceramic circuit carriers, a structure which provides not only enhanced heat dissipation, but also added ground or electrical shielding characteristics is generally provided using two techniques.

The first technique involves directly affixing integrated circuit chips to metal heatsinks that are bonded or laminated to the circuit carriers. In these applications, wirebonded chips are generally attached to the metal heatsinks with epoxy based adhesives that may contain incorporated electrically conductive particles and/or thermally conductive particles to reduce thermal resistances of chip-heatsink interfaces. The second technique involves directly affixing integrated circuit chips to circuit carrier surfaces possessing chip attach pad locations that are electrically and thermally interconnected by metal filled or plated vias to large metal ground or shielding planes present within or on the opposing side of the circuit carrier.

Although direct chip attach (DCA) to either heatsink structure provides an effective solution for both heat dissipation enhancement and rudimentary electrical isolation, the adhesives used to affix chips to heatsinks or carrier surfaces are not readily reworkable. Therefore the vast majority of electrical, manufacturing assembly, and test losses associated with the chip assembly are non-recoverable. These yield detractors encompass known good die (KGD) issues and most common DCA assembly and manufacturing process flow defects including adhesive overflow onto bond pads, misoriented die, mechanically damaged die, wirebond pattern recognition errors, and wirebond sweeps, as well as other bond and post-bond test introduced defects. For single chip packages these yield losses can usually range to several percent, while yield losses in multi-chip assembly configurations can range to 30% or more depending on the assembly complexity. Given the aggregate potential for assembly yield loss coupled with the high volume manufacturing requirements associated with assembly of most packages that rely on chip on flex (COF) and chip on board (COB) technologies (typically 1,000 to 100,000 per week), it is clear that significant cost savings could be realized by the development and implementation of a simple and cost effective DCA to heatsink packaging structure that supports chip rework and replacement.

A resolution to the above problems is found in the application of the techniques of U.S. patent application Ser. No. 08/349,854, filed Dec. 6, 1994, and entitled REWORKABLE ELECTRONIC APPARATUS HAVING A FUSIBLE LAYER FOR ADHESIVELY ATTACHED COMPONENTS, AND METHOD THEREFOR and U.S. patent application Ser. No. 08/530,452, filed Sep. 19, 1995 and entitled METHOD AND SYSTEM FOR REWORKABLE DIRECT CHIP ATTACH (DCA) STRUCTURE WITH THERMAL ENHANCEMENT, both assigned to the assignee of the present Patent Application. The use of a layer of fusible material, such as solder, enables the adhesive or cement that bonds the chip to the carrier to be removed with the chip. This avoids the necessity to scrape, grind or abrade the carrier location of chip attachment to remove residual cement or adhesive. Accordingly, the difficulty, cost and added part loss occasioned by the residual cement removal procedure are avoided.

Although these solutions are a resolution of the problem, the application of heat is required to effect the separation. The temperature must be great enough to soften the fusible material sufficiently to release the chip from the carrier while not being high enough to damage the electronics on either the chip or the carrier. Although the procedure can be practiced within manageable temperature ranges, the reworking would be expedited if the process of separation could be effected directly without the imposition of an elevated temperature.

When the carrier used is a heatsink, the heat dissipation characteristics make the application of heat more critical and the margin for error more limited. In this environment, an alternative to the process of heating the assembly would be of even greater benefit. A more direct means for separating the chip from the remainder of the assembly would not only simplify the process, but also reduce the incidence of heat or mechanical damage that reduce the yield of reworked assemblies.

Further cost benefits could be achieved if the cured adhesive attachment of the direct attach device could be wholly eliminated. The adhesive application and cure processes are time consuming and expensive, and can account for a significant portion of the manufacturing assembly costs of small form factor packages. For example, the adhesive dispense and cure operations required for conventional direct chip attach on arm electronics cables such as those used in state of the art small rigid disk drive products can encompass approximately 25 percent of the total component subassembly cost. Moreover, as previously discussed, once the epoxy adhesive is cured, rework/repair or replacement of defective chips or chip site defects is not cost effective. Therefore, the development of an economical chip attach structure and assembly process that is both reworkable and provides for elimination of costly and time consuming adhesive processing steps is of great economic value to industries that provide high volume form factor packaging of electronic assemblies.

A still further problem associated with electronic assemblies used in particular environments is the compactness required to meet the requirements of specific applications. For example, flexible circuitry and card electronic assemblies used in rigid disk data storage devices, telecommunications equipment, portable computers, computer peripherals, and a host of consumer electronics generally require high density packaging of components and compact efficient electronic carrier integration in form factor packages. The physical constraints within the various form factor designs in many of these packaging applications restricts both area and height available for electrical carrier wiring component placements, device interconnections, and carrier attach within form factor housings. The limited three dimensional space available for the electronics usually drives one or more forms of packaging minimization including the use of thin, flexible carrier materials with fine line/space/via wiring, small passive discrete components and various direct chip attach technologies to support integration and placement of silicon devices include wirebonded chip on flex and wirebonded chip on board attach methods. However, in addition to providing for space savings, the packaging design and assembly methods must also support high volume, low profit margin manufacturing, since the bulk of high density form factor packaging is used in low cost consumer electronics applications.

Unfortunately, low cost manufacture of form factor electronics using direct chip attach technology is inherently difficult, since most all direct chip attach processes and package structures are relatively expensive to produce, as manufacturing requires multiple steps with specialized equipment,, and slow throughput batch assembly steps involving chip adhesive and/or encapsulant application and cure steps. Moreover, additional cost is usually incurred from assembly fallout due to inability to test for known good chips and from inability to rework many direct chip attach structures in use today. Additionally, the many steps requires for direct chip attach assembly, ultimate manufacturing cost, yields, and subsequent integration of direct chip attach carrier assemblies into the form factor packages are also highly dependent on the application specific carrier package designs.

SUMMARY OF THE INVENTION

In the present invention, chip rework capability for DCA to heatsink packaging configurations is provided through use of separable metal heatsink laminate and heatsink tape structures that allow for fast, simple and simultaneous removal of both chips and nonreworkable chip attach adhesives. The complete heatsink laminate structure consists of a base metal heatsink and a thin metal foil layer that are bonded together with an adhesive layer. The adhesive layer defines the separable heatsink laminate bond interface and can be made using dry film adhesives and lamination processes, or with the use of pressure sensitive adhesives (PSA's). To fabricate the heatsink structure using PSA's, the adhesive may be used in free standing sheet form or the adhesive can be present on the metal foil. In the latter application of the PSA, a metal tape consisting of the PSA bonded to metal foil is attached to the base metal heatsink to create the heatsink laminate structure. In addition, the adhesive layer may also be impregnated with thermally and/or electrically conductive particles to enhance heat dissipation and/or electrical characteristics of the heatsink laminate interface if required. Chips are attached to the heatsink using a conventional (ie non-reworkable) die attach adhesive. After the chip attach adhesive has cured, electrical connection of the chip input/output terminal pads to the carrier circuitry are made with wire bonds.

When defects are present that require chip removal and replacement for repair of the electronic component or assembly, the chip and die attach adhesive are readily removed by peeling away the separable metal foil layer of the heatsink laminate in the area of the attached chip. Defective chip assembly removal is accomplished by first mechanically removing all wirebonds and cutting through the metal foil bonded to the base metal heatsink in the vicinity of the die attach adhesive perimeter using manual tools or patterned stamp cutting methods. Next, an edge or corner of the foil is peeled up from the base metal heatsink, followed by complete removal of the area of foil around and under the chip and die attach adhesive. Because the die attach adhesive and defective chip are bonded to the foil, simultaneous removal of both chip and die attach adhesive occurs as the metal foil is peeled off the base metal heatsink. Chip replacement is accomplished by simply attaching a new chip to the base heatsink material using fresh die attach adhesive, followed by wirebond attachment to carrier interconnect pad surfaces.

The use of a laminated heatsink including a foil layer permits the use of a foil of one metal and a heatsink formed of another metal to impart varying characteristics in the laminated structure. Typical is the use of copper foil to make the top surface of the laminated assembly solderable. This configuration is also usable on a board with internal ground planes which function as a heatsink.

In another embodiment of the invention, the direct attach integrated circuit device is secured to the carrier or heatsink at the chip attach location using a foil layer with an adhesive coating on each side to afford both a simplified assembly and attachment structure while providing for ease of rework, when required, by having the peelable foil layer at the attachment interface. The foil layer may be used either at a chip attach location on the carrier or at the surface of a metal heatsink that is adhered to the carrier assembly at a hole in the carrier that defines the chip attach location. In this configuration, elimination of chip attach adhesive is achieved.

A further modified form of the invention may be used when it is critically important to achieve a compact electronic assembly structure or minimize the profile of an electronic package including a direct attach integrated circuit device and a carrier assembly. To reduce the maximum height of the electronic package, the chip attach site in the carrier assembly is defined by aligned openings that extend through both the carrier and a heatsink or heat spreader which is adhered to the carrier. A foil layer adjoins the heatsink and has the adjoining surface coated with a pressure sensitive adhesive to bond the foil to the heatsink and present an adhesive coated surface at the chip attach location. If the electronic package is to be supported on an adjacent surface of the associated device, the foil is provided with an adhesive coating on both surfaces. The foil adhesive costing at the surface remote from the carrier element can be covered with a release sheet to protect the adhesive layer prior to the assembly of the electronic package to the using device.

In any of the applications shown and described, the adhesive layer or layers on the foil may contain filler materials to enhance the thermal conductivity, make the adhesive layer electrically conductive or impart both characteristics to the adhesive layer or coating. Moreover, the use of filler material increases adhesive layer rigidity which enhances high yield wirebonding. As the support for terminal pads is made more rigid, the ultrasonic energy transferred to the interface where bonding occurs effectively functions to create the wirebond. To the extent that the bonding surface is subject to flexible or resilient support, the ultrasonic energy can be partially dissipated imparting micromotion to the terminal pad which impairs alignment and also the diminished concentration of energy at the bonding interface reduces the quality of the bond.

DETAILED DESCRIPTION

Figure 1:
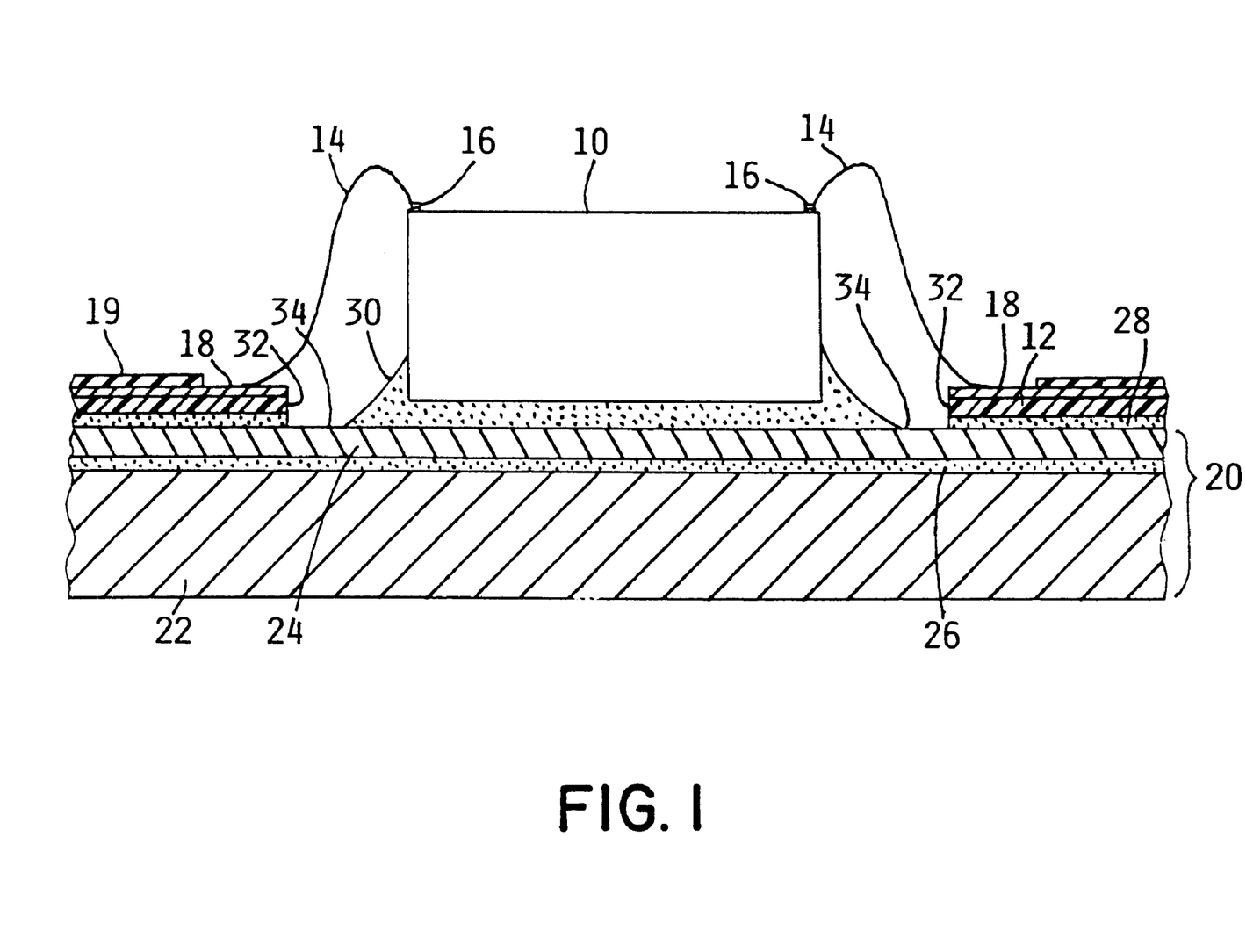
FIG. 1 is an interrupted elevation view, partially in section, of a chip carrier with a heatsink mounted at a cutout chip attachment site including the laminated heatsink structure of the present invention with a continuous foil layer.

FIG. 1 illustrates a direct chip attach (DCA) assembly wherein a chip 10 is effectively attached to a base circuit carrier 12 and electrically connected to the circuitry of such carrier by wirebonds 14 that extend from chip external electrical contacts 16 to wire traces or terminal pads 18 on the carrier. Base carrier 12 may be formed of any of a variety of materials such as polyimide, epoxy/glass board or ceramic; may be rigid or flexible and include one or more layers supporting conductors with conductor terminal portions presented adjacent the chip location that extend from the electrically insulating coating 19. As shown, the carrier 12 has a cutout opening 32 at the location where direct attachment of a chip to the heatsink is required. Chip 10 is mounted on a heatsink laminate assembly 20 which includes the metal heatsink 22 and a thin foil layer 24 which are laminated together by an adhesive layer or film 26. The heatsink laminate assembly 20 is secured to the carrier 12 by an adhesive bonding film 28. Chip 10 is mounted on the heatsink laminate assembly 20 by a die attach adhesive 30, such as a cured epoxy material which is non-reworkable. When it is necessary to remove the chip, using the die attach adhesive material 30 as the separation interface, the cured adhesive breaks away irregularly, requiring that the portion that remains on the carrier assembly to be scrapped or abraded from the surface before a replacement chip may be installed.

The heatsink laminate assembly 20 includes the metal heatsink 22, a foil layer 24, and an adhesive film 26 that bonds the foil to the heatsink. The adhesive film layer 26 may be formed of dry film adhesive and a corresponding lamination process or, in the preferred form for practicing the invention, a pressure sensitive adhesive (PSA) either in the form of a free standing sheet or as a foil tape with a coating on the foil layer. In addition, this adhesive layer may be impregnated with particles which enhance the thermal conductivity, the electrical conductivity or both. Commonly the heatsink is formed of aluminum and the foil is an aluminum foil. However, dissimilar metals can also be used in the heatsink laminate structure to impart other special properties for assembly applications. For example, by using an aluminum base metal heatsink with a laminate foil layer of copper, the heatsink laminate assembly surface can be made to be solderable or made to readily accept noble metal platings.

When rework of the electronic assembly requires removal and replacement of chip 10, the wirebonds 14 are mechanically removed and the foil layer is cut in the region 34 between the edge 32 of the carrier cutout opening and the adhesive 30 which cements the chip to the heatsink laminate assembly. The foil may be cut using manual tools or using patterned stamp cutting methods. With the foil portion underlying the die attach adhesive 30 severed from the balance of the foil layer, the foil underlying the die attach adhesive may be peeled away, starting at a corner, to separate chip, die attach adhesive and foil portion as a unit from the remainder of the carrier electrical assembly along the interface formed by the PSA adhesive film 26. Chip replacement can be effected by mounting a replacement chip with fresh die attach adhesive or by restoring a patterned layer of foil to the heatsink at the carrier cutout opening and thereafter attaching the replacement chip using die attach adhesive. Replacement is then completed by restoring the wirebond connections between chip external electrical contacts and corresponding carrier conductor terminal pads.

Figure 2:
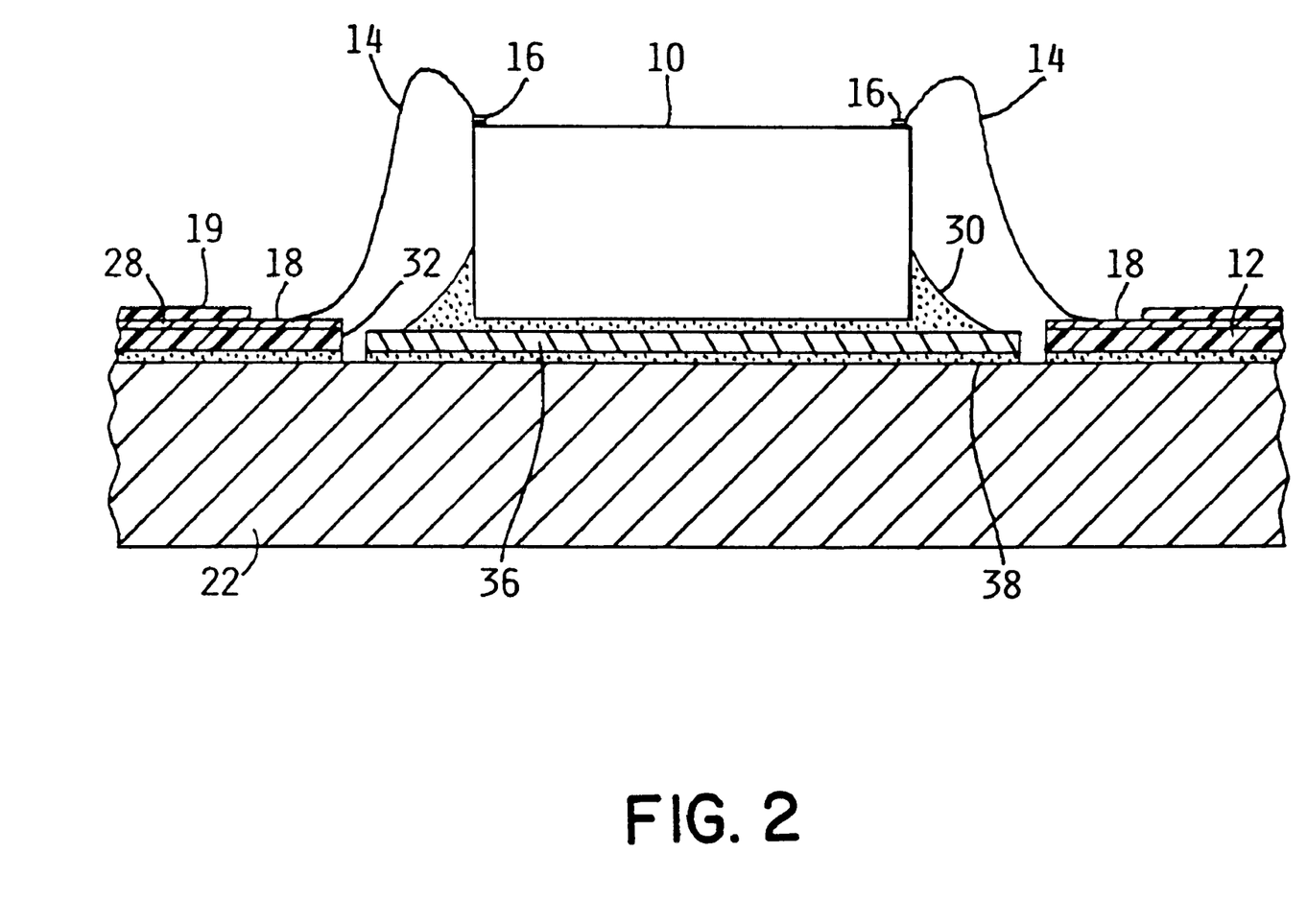
FIG. 2 is similar to FIG. 1, but includes a patterned foil layer laminated to the heatsink solely at the chip attach site.

FIG. 2 is similar to FIG. 1 in providing a carrier assembly with a cutout opening 32 at which a chip 10 is mounted to a heatsink 22 bonded to the carrier 12 by an adhesive 28. In this embodiment, the foil structure 36, which is patterned to be present only at the chip location within the carrier opening 32 with the metal heatsink being bonded directly to the carrier 12. The foil layer is adhered to the metal heatsink 22 by PSA layer or film 38 to provide the interface of separation if rework should require that chip 10 be removed. Chip 10 is adhered to the foil 36 in the conventional manner with die attach adhesive 30 and is connected to the carrier assembly circuitry by wirebonds 14. The modified assembly structure of FIG. 2 makes the chip removable directly without the cutting process step that is necessary to separate the foil underlying the chip and die attach adhesive from the remainder of a continuous foil layer laminated to the heatsink.

The modified structure of FIG. 2 is particularly useful when metal foils are bonded to base metal heatsinks using PSA materials. Many PSA materials may not possess adequate rigidity to allow for efficient transfer of ultrasonic energy during the wirebonding process when present under certain carrier materials such as polyimides. As a consequence, low wirebonding yields can result from bonding to "soft" carrier structures having PSA beneath the carrier bond pads. However, by using a patterned metal foil on the heatsink beneath only the rigid chips, wirebonding problems are essentially eliminated. Again, further rigidity of adhesives can be attained through addition of fillers. When free standing adhesive bond films (non-PSA) are used along with lamination processes to built the heatsink structure, foil or base metal heatsink surface textures can also be modified through chemical or mechanical means to lower adhesion characteristics to accommodate easier foil removal during a chip rework/replacement steps.

Figure 3:
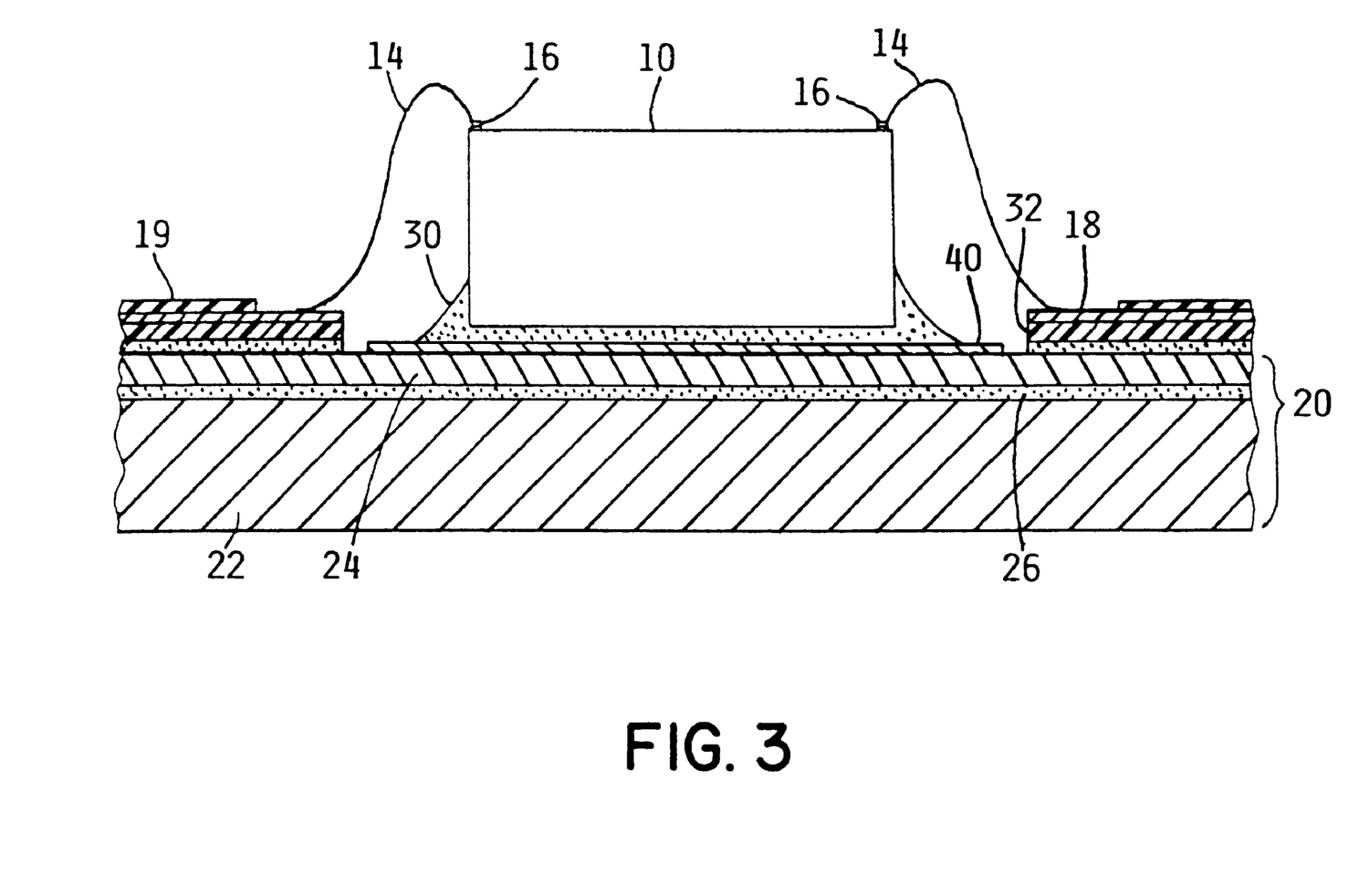
FIG. 3 is similar to FIG. 1 and further includes a fusible layer intermediate the laminated heat sink and the die attach adhesive securing the chip.
Figure 4:
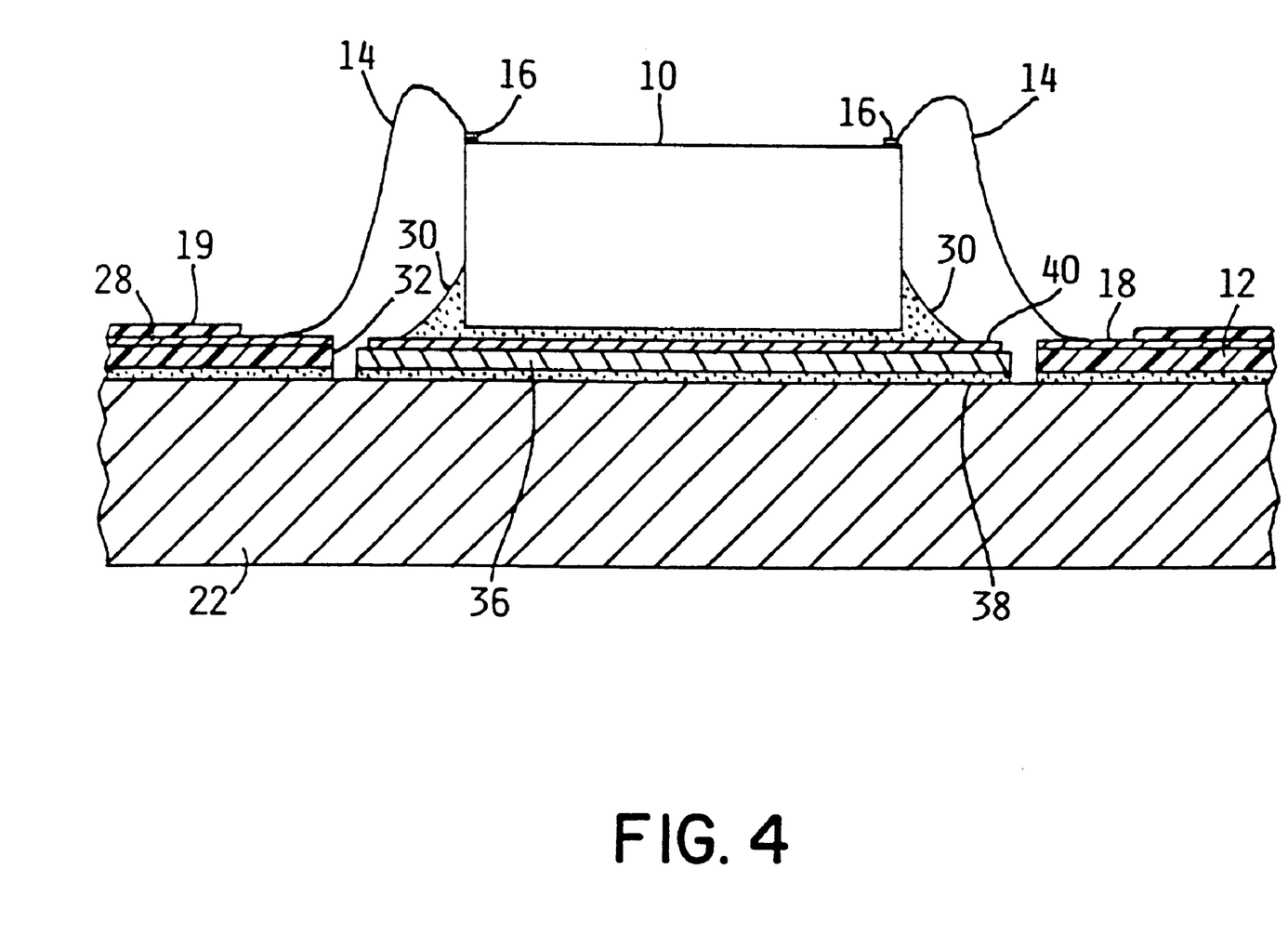
FIG. 4 is similar to FIG. 2 further including a fusible layer between the patterned foil and the die attach adhesive.

Another important feature of the invention is that dissimilar metals in the heatsink structure can also be used to impart other special properties for assembly applications as well. For example, by using an aluminum base metal heatsink with a laminate foil layer of copper, the heatsink can also be made solderable, or made to readily accept noble metal platings. For a solderable heatsink laminate configuration, a variation of the packaging structure would enable the process and method described in U.S. patent application Ser. No. 08/349,854 (previously identified herein) to be available as an alternative option for chip removal. This modification of the invention is illustrated in FIG. 3 and FIG. 4, which are respectively similar to FIGS. 1 and 2. FIG. 3 shows a heatsink structure for direct chip attach that is similar to the structure of FIG. 1 wherein an aluminum heatsink 22 is laminated to a copper foil 24, which completely covers the heatsink surface, using an adhesive layer or film 26. Overlying the copper foil is a pattern layer of solder 40 in the carrier cutout region where the chip 10 is mounted using die attach adhesive 30. Likewise, FIG. 4 shows a structure similar to that of FIG. 2 wherein a pattern coverage of copper foil 36 is laminated to the heatsink by a PSA film 38 in the carrier chip site cutout area and a layer of solder 40 on the copper foil underlies the chip 10 and die attach adhesive 30. In this configuration, there is the option to remove and replace the chip 10 without removing the copper foil layer at the top surface of the heatsink laminate assembly.

When the solder layer is present, the chip may be removed either by peeling away the foil underlying the combined chip and die attach adhesive, using the adhesive layer, securing the foil to the heatsink base, as the interface of separation or by the application of sufficient localized heat to allow the chip and die attach adhesive to separate from the laminated heatsink assembly with the solder layer as the interface of separation.

The invention provides an easy and cost effective method for direct chip attach assembly rework on multiple carrier types including epoxy/glass board, flex and ceramic single chip modules, multi chip modules and circuit board assemblies. Soldering chips to heatsinks requires that both chip and heatsink have solderable metallurgy present. Backside metallization on chips is fairly common, but is expensive. Also, in some instances, cost effective solderable metallizations on the heatsink structure (such as copper) are incompatible with the packaging application. These incompatibilities require that expensive noble/semi noble coatings be used in order to solder chips to heatsink surfaces. By using the invention disclosed herein, need for the use of expensive heatsink overcoat and backside metallization layers is eliminated. Simple mechanical removal of chips and adhesives requires the use of milling or grinding operations to remove residual die attach adhesive from the mounting location on the carrier. These operations are costly, time consuming, require special tooling and fixturing, can induce damage to components and/or assemblies, and require use of secondary cleaning operations to rid assemblies of particulate contamination. Chemical removal of chip adhesives causes many problems similar to those encountered with mechanical removal operations, along with other issues of concern including the need for use of harsh, caustic and environmentally undesirable solutions, and the potential for chemical incompatibility with some materials comprising the assembly. Secondary cleaning operations and potential for use of added chemical neutralization steps are also required to eliminate possible corrosion on reworked assemblies as well. Although chip rework can be used (ie, good chips glued on top of defective chips, then wirebonded), application of this technique is restricted to niche package assemblies that possess relaxed carrier bond pad geometries and negligible z-height form factor packaging constraints. In contrast, the current invention is compatible with tightly pitched direct chip attach wiring geometries, and initially imposed form factor packaging constraints for most direct chip attach to heatsink packaging configurations for chip on board, chip on flex, single chip module and multi chip module assemblies.

Figure 5:
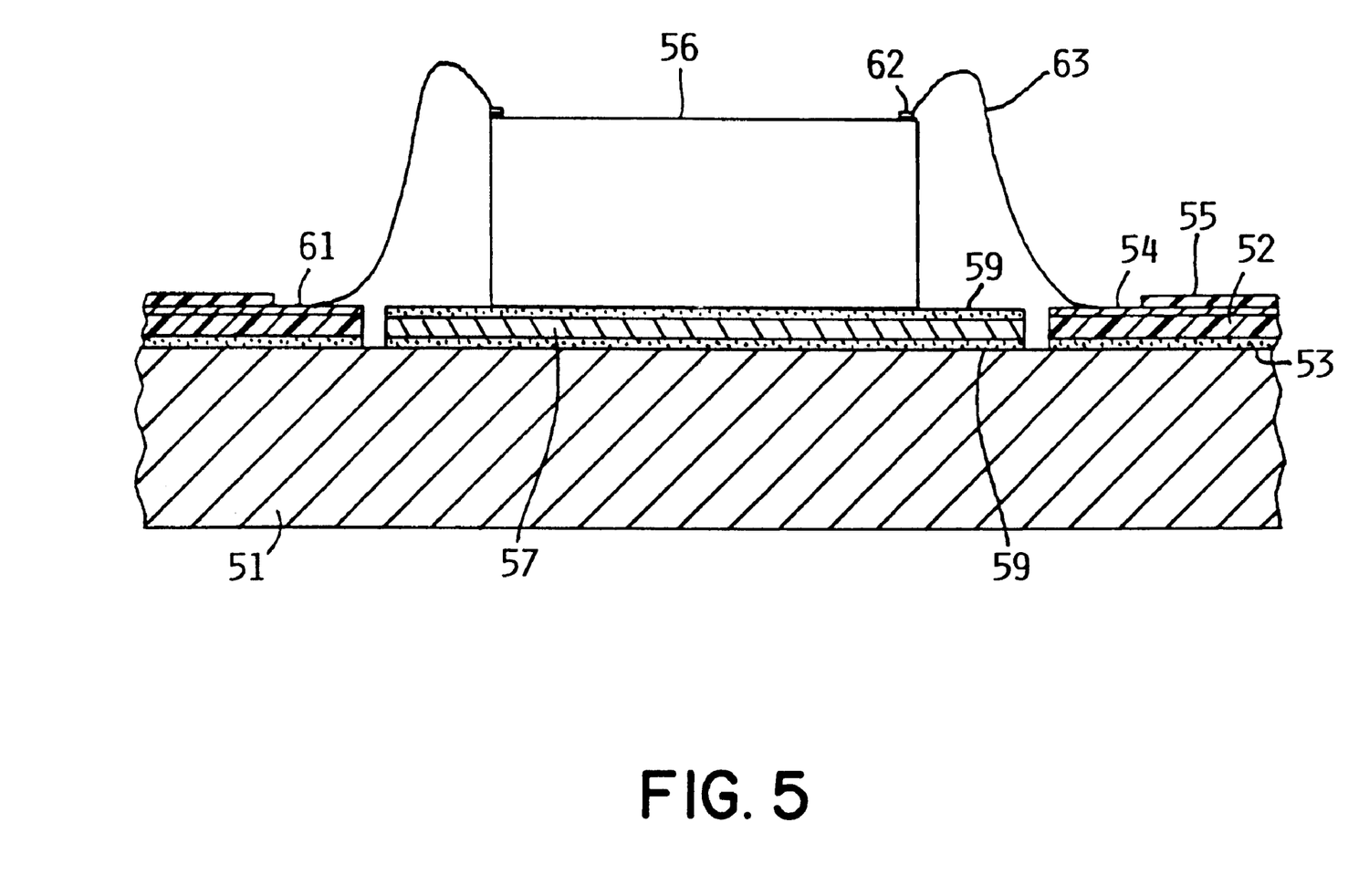
FIG. 5 is an interrupted elevation view, partly in section, with a heatsink mounted at a cutout chip attachment site and the chip attached using a foil layer with double sided adhesive.

The embodiment illustrated in FIG. 5 provides the solution to provide for both assembly cost reduction and chip rework/replacement capability. This combination of capabilities is achieved through development of a packaging structure and assembly process in which a removable, double sided, thermally and/or electrically conductive tape is used as a chip carrier attach medium in place of conventional dispensed or screen printed chip attach adhesives. Key elements of this direct chip attach package structure are depicted in FIG. 5 and illustrate use of the disclosed tape/attach method for a package structure similar to that shown in FIG. 1. In FIG. 5 the complete package structure consists of a base metal heatsink 51 that is laminated to a circuit carrier 52 (formed of a material such as polyimide, FR4, epoxy/glass or ceramic) with a patterned adhesive bonding film 53. Circuit carrier 52 possesses metal circuit wiring 54 and insulating coverfilm 55 with openings in areas where direct attach of chips 56 to heatsink 51 is required. However, in the configuration of FIG. 5, chips 56 are attached to the base metal heatsink 51 using a metal foil or tape layer 57 that possesses pressure sensitive adhesive layers 59 on both upper and lower surfaces of the foil 57. The foil/tape 57 with double sided adhesive layers 59 can be applied to either carrier or chip surfaces via use of patterned decals present on a release sheet or in a tape and reel form with methods commonly used for attaching labels. A free standing pressure sensitive adhesive layer (no intermediate foil layer) can also be used as a chip to carrier attach medium as well, and can be attached using identical methods. Optimum thermal performance and/or electrical grounding capabilities are achieved by using a foil 57 with adhesive layer(s) 59 that are both textured and impregnated with thermally and/or electrically conductive particles that provide heat dissipation and/or electrical continuity between the carrier/chip attach interfaces. Particulate fillers also rigidize the chip-carrier interface to enhance wirebonding yield. Chips 56 are attached to the package via placement onto the surface of pressure sensitive adhesive surface using a conventional auto-placement tool, followed by electrical interconnection of chip 56 input/output terminals 62 to carrier circuitry pads 61 via wirebonds 63. If defects are present on the chip or chip assembly area, the chips can be easily reworked or replaced by peeling the adhesive foil/tape and the attached defective chip from the base carrier surface. After wirebond and chip removal, chip replacement is provided through application of a new adhesive foil/tape layer(s) piece to the carrier chip site. New wirebonds are then added to the chip and previously unbonded regions of the carrier interconnect pads.

Figure 6:
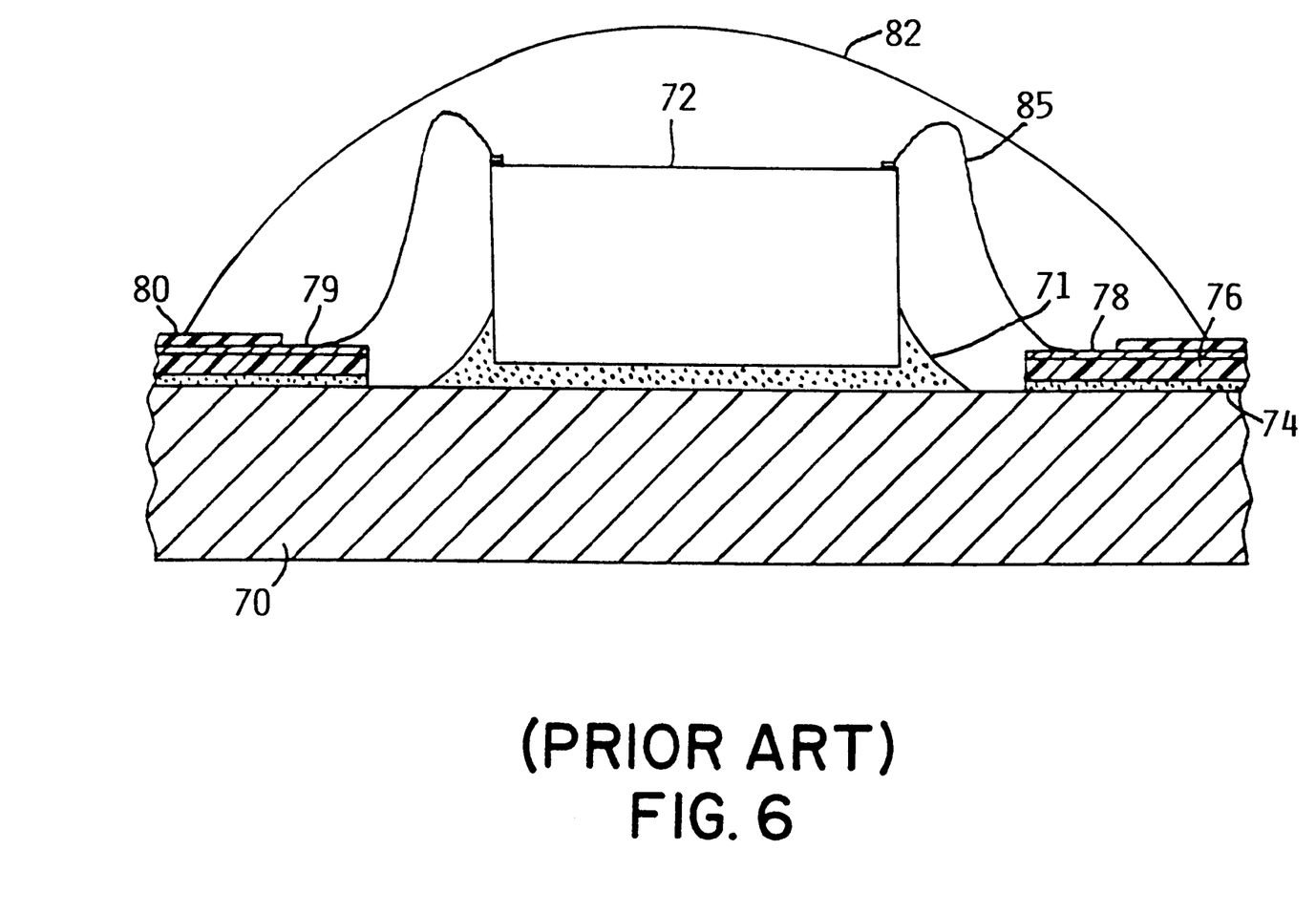
FIG. 6 is a prior art showing of chip on flex mounting wherein the chip is secured to a heat spreader laminated to the carrier assembly.
Figure 7:
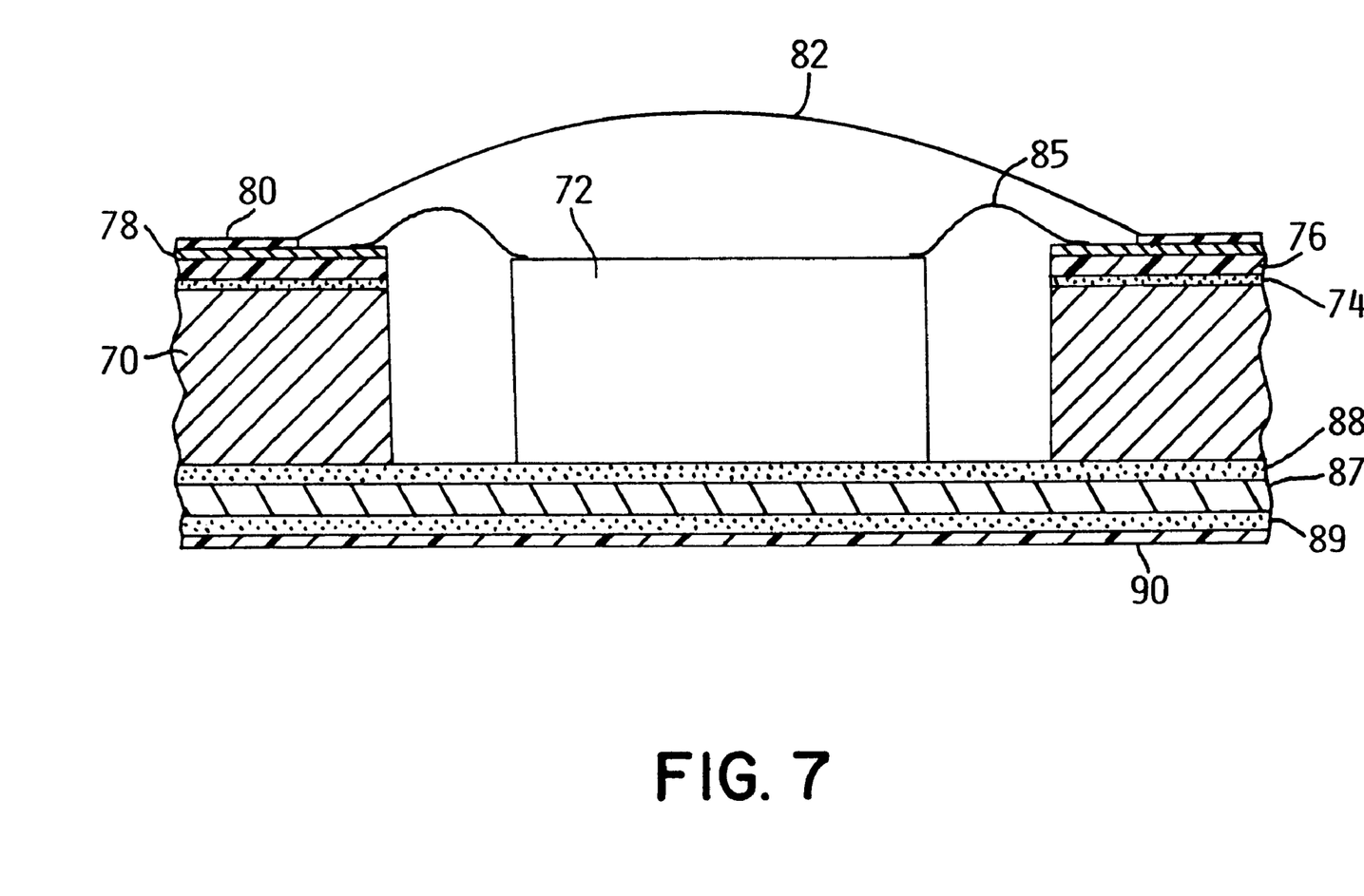
FIG. 7 illustrates the tape cavity packaging (TCP) of the present invention wherein the chip is mounted within aligned openings in a carrier/heatsink assembly and secured to a foil layer adhered to the heatsink lower surface to reduce wirebond wire lengths and heights, simplify encapsulation, and reduce the profile of the completed assembly.

FIGS. 6 and 7 illustrate the current status and a solution to the problem of providing a compact electronic package that must meet the constraints of the restricted physical dimensions of a form factor and further be produced by low profit margin manufacturing techniques compatible with the requirements of low cost consumer electronics applications. A solution to the broad based problem is provided through the development of a tape cavity packaging (TCP) structure in terms of both cost reduced DCA packaging of carrier electronics and the subsequent integration of TCP packaging assemblies into form factor electronics.

A conventional COF/COB wirebond structure used in many current applications including pagers, disk drive flexible circuitry and state of the art transceiver packages is shown in FIG. 6. This structure consists of a flexible circuit material, printed wiring board or equivalent circuit carrier 76, with metal wiring 78, electrically insulating overlay 80 and plated wirebond interconnect pads 79. In FIG. 6, the circuit carrier 76 is laminated to an aluminum heat spreader 70 with an adhesive layer 74. A silicon integrated circuit (chip) 72 is attached directly to aluminum heat spreader 70 with an adhesive 71 which is dispensed onto the heat spreader prior to chip placement. Following chip placement, the adhesive must be cured via heat, usually for about an hour at 125–150 degrees centigrade in a batch oven. After adhesive cure, wirebonds 85 interconnecting chip 72 to plated wirebond interconnect pads 79 are installed. Wirebonds 85 are then protected by application of an organic, heat or UV cured encapsulant material 82. The DCA carrier sub-assembly (defined by the above elements) is then affixed to or within another sub-assembly, sub-housing or primary surface of the final form factor package using adhesive, screws, rivets, pegs or other attachment means or media. Although the use of conventional COFICOB DCA structure is common, several design, materials and process disadvantages exist that add cost, reduce performance, add complexity, and prompt potential for manufacturing yield loss. Examples include the following conditions and structure. The technique requires use of chip attach adhesive, dispense and batch cure operations. If electrically conductive chip attach adhesive is required, adhesive squeeze out and shorting of bond pads causes assembly yield loss. Chip attach adhesives cannot be removed once cured to support chip rework or replacement. Chip to carrier bond pad spacing design constraints place limits on wireloop heights and wirebond lengths. These geometric constraints inhibit full optimization of both electrical performance (lowest possible wire inductance) and overall package height minimization. Secondary attach processes, material, and/or parts are required to affix the COF/COB sub-assembly to housings or form factor package surfaces.

FIG. 7 shows the tape cavity package (TCP) structure for COF/COB technology. In the TCP packaging configuration, the laminated carrier assembly, including carrier 76, metal wiring 78 and electrically insulating overlay 80, is laminated to aluminum heatsink by an adhesive layer 74. Both the carrier assembly and the heatsink 70 have holes or openings at the chip attach locations. A metal or organic tape or foil material 87, with adhesive layers 88 and 89 on the upper and lower sides respectively, is attached to the lower surface of the aluminum heatsink 70 by the pressure sensitive adhesive layer 88. The attached tape or foil closes off the opening in the aluminum heatsink 70 and creates a cavity in the package. Chip 72 is then attached to the adhesive present on the exposed tape at the base of the chip attach cavity. Use of thermally or electrically conductive tape is also possible through proper selection of tape core and adhesive filler materials. Several commercially available tapes, which possess these attributes, can be used to optimize heat dissipation and/or electrical ground characteristics. Typical heatsink attach thermally and/or electrically conductive tapes with metal or polymer tape cores are manufactured by Adhesive Research Co. (AR 9045 and AR 8044) or Chromerics Corp. (XTS 412 or T 405).

After wirebonds 85 are added and encapsulant 82 is applied and cured, the COF/COB carrier sub-assembly can be adhesively affixed to a housing or primary surface of a given form factor package by removing the backside tape adhesive release sheet 90. Conversely, in-situ assembly of the COF/COB carrier on a given housing or form factor package surface is also possible by first removing the backside adhesive release sheet 90 and affixing the tape/heatsink/carrier assembly to a housing or form factor package surface prior to chip placement, wirebonding, and encapsulation.

Several structural and assembly process advantages are obtained with the use of the TCP structure, as shown and described, which overcome prior art problems previously identified. TCP eliminates chip dispense and cure operations and is reworkable. Defective chips can be removed from the tape adhesive and replaced, or the tape and chip can be removed simultaneously from the heatsink, followed by tape and chip replacement. The structure eliminates yield loss concerns from chip adhesive squeeze out onto pads and improves thermal conduction pathways for heat dissipation through elimination of added interface layers and thermal resistances. TCP provides a superior structure for enhanced electrical performance, compact packaging, and wirebond robustness. For example: wire lengths can be reduced as much as 25–40%, thereby improving electrical wirebond characteristics (lower inductance and time of flight); wire loop heights can be reduced by 40–50%. Loop height reduction allows for greater space savings and higher yield encapsulation processing (low wire loops are easier to encapsulate completely with reduced potential for encapsulant flow onto other critical areas of electronic assemblies); and in many applications, tight wirebond spacing from chip to carrier pads requires that chip thickness be reduced through lapping to eliminate acute, non-robust wirebond geometries. By wirebonding chips in a TCP, packaging design parameters usually required for robust wirebonding are relaxed and the need for potential chip backlapping is eliminated. TCP also eliminates the need for, and the cost of secondary carrier attach materials, process, and/or parts required for assembly to housings or form factor package surfaces.

TCP can also be used for chip on board applications where the tape is applied directly to the backside of the rigid printed circuit board (PCB). For this COB application, hole in the PCB would be present at chip attach locations. Since the circuit board is rigid in this case, a metal heatsink/stiffener is not necessarily required.

While the invention has been shown and described with reference to preferred embodiments, it will be understood by those skilled in the art that various changes in form and details may be made without departing from the spirit and scope of the invention.

What is claimed is:

1. A method of fabricating an electronic assembly including component chips with a flat surface at a pad location presented by a carrier assembly which includes wiring means for connecting such components to other electronic assembly components comprising adhering a foil film layer at said pad location;

applying a coating of die attach adhesive to said foil film layer at said pad location;

attaching a component chip to said adhesive layer at said pad location;

connecting said component chip to said wiring means on said carrier assembly;

determining that said component chip mounted at said pad location must be replaced;

removing said component chip from said electronic assembly by peeling said foil film layer from said pad location to remove said foil film layer, said die attach adhesive and said component chip as a unit;

replacing said coating of die attach adhesive at said pad location;

attaching a replacement component chip to said die attach adhesive at said pad location; and connecting said replacement component chip to said wiring means on said carrier assembly.

2. The method of fabricating an electronic assembly of claim 1 wherein said electronic assembly is formed by adhering said foil film layer to the surface of a heatsink member to form a laminated heatsink assembly and adhering said laminated heatsink assembly to said carrier assembly with the surface of said foil layer presented at a cutout opening in said carrier that defines said pad location.

3. The method of fabricating an electronic assembly of claim 2 where said electronic assembly is formed by adhering said foil film layer to said heatsink surface over an area that exceeds the surface area presented at said carrier cutout opening, and the step of removing the chip, die attach adhesive and foil film layer is preceded by the step of cutting said foil film layer within said cutout opening and about the periphery of said die attach adhesive to separate the foil film underlying said die attach adhesive from the remainder of said foil film layer adhered to said heatsink.

4. The method of fabricating an electronic assembly of claim 3 wherein prior to the step of replacing said coating of die attach adhesive the method includes the step of adhering a patterned layer of foil film to the area of said heatsink surface from which the foil layer has been removed.

5. The method of fabricating an electronic assembly of claim 2 wherein said electronic assembly is formed by adhering a patterned layer of foil film to said heatsink surface that lies wholly within said cutout opening when said laminated heatsink assembly is adhered to said carrier assembly.

6. The method of fabricating an electronic assembly of claim 5 wherein prior to the step of replacing said coating of die attach adhesive the method further includes the step of adhering a replacement patterned layer of foil film to said heatsink surface from which said patterned layer of foil film was removed.

7. A method of fabricating an electronic assembly including a component chip with a flat surface to be secured at a chip attach site on a carrier assembly which includes wiring means for connecting such component chip to other components on said carrier assembly comprising the steps of forming an opening through said carrier assembly that defines a chip attach site;

attaching an adhesive coated foil layer to said carrier assembly spanning said opening through said carrier wherein said adhesive coating secures said foil layer to said carrier to create a chip attach cavity with an adhesive coated surface on said foil layer presented at the base of said cavity;

attaching a chip in said cavity with said chip secured by said adhesive coated surface at the base of said cavity; and electrically connecting said chip to said carrier assembly wiring means.

8. The method of fabricating an electronic assembly of claim 7 wherein said carrier assembly is formed by laminating a carrier element to a heatsink; said opening through said carrier assembly comprises aligned openings through said carrier element and said heatsink; and said base surface of said chip attach cavity is formed by the adhesively coated foil layer adhered to said heatsink.

9. The method of fabricating an electronic assembly of claim 8 wherein the step of electrically connecting said chip comprises the wirebonding of said chip to said carrier assembly and said method further comprises applying encapsulant to enclose said chip and said wirebonds.

10. The method of fabricating an electronic assembly of claim 9 wherein said step of adhering an adhesive coated foil layer comprises adhering a foil layer with adhesive coatings on both sides and said method further comprises the step of adhering said electronic assembly to a mounting surface using the adhesive coating on the foil surface not adhered to said heatsink.

* * * * *